United States Patent [19]

Wei et al.

[11] Patent Number: 5,399,884
[45] Date of Patent: Mar. 21, 1995

[54] RADIATION IMAGER WITH SINGLE PASSIVATION DIELECTRIC FOR TRANSISTOR AND DIODE

[75] Inventors: Ching-Yeu Wei; Robert F. Kwasnick, both of Schenectady; Brian W. Giambattista, Scotia, all of N.Y.

[73] Assignee: General Electric Company, Schenectady, N.Y.

[21] Appl. No.: 149,888

[22] Filed: Nov. 10, 1993

[51] Int. Cl.$^6$ ............................................. H01L 27/14
[52] U.S. Cl. ..................................... 257/59; 257/291; 257/292; 257/443
[58] Field of Search ................. 257/59, 443, 291, 292, 257/290, 40, 446, 766, 642, 643, 640; 250/370.09, 370.11, 361 R, 208.1

[56] References Cited

U.S. PATENT DOCUMENTS

| | | | |
|---|---|---|---|
| 4,719,498 | 1/1988 | Wada et al. | 257/292 |
| 5,075,244 | 12/1991 | Sakai et al. | 257/59 X |
| 5,132,539 | 7/1992 | Kwasnick et al. | 250/361 R |
| 5,153,438 | 10/1992 | Kingsley et al. | 250/370.09 |
| 5,179,284 | 1/1993 | Kingsley et al. | 250/370.11 |
| 5,187,369 | 2/1993 | Kingsley et al. | 250/370.11 |
| 5,198,694 | 3/1993 | Kwasnick et al. | 257/766 |
| 5,216,491 | 6/1993 | Yamamoto et al. | 257/292 X |
| 5,233,181 | 8/1993 | Kwasnick et al. | 250/208.1 |

FOREIGN PATENT DOCUMENTS

| | | | |
|---|---|---|---|
| 62-142351 | 6/1987 | Japan | 257/292 |
| 62-293763 | 12/1987 | Japan | 257/292 |
| 63-158871 | 7/1988 | Japan | 257/292 |
| 63-174361 | 7/1988 | Japan | 257/292 |
| 0165867 | 3/1989 | Japan | 257/292 |
| 3109770 | 5/1991 | Japan | 257/292 |

OTHER PUBLICATIONS

Application entitled, "Method for Reduction of Off-Current in Thin Film Transistors," Ser. No. 08/130,807, filed Oct. 4, 1993.

Application entitled, "Method for Fabricating Solid State Radiation Imager Having Improved Scintillator Adhesion," Ser. No. 08/115,084, filed Sep. 2, 1993.

Application entitled, "Solid State Radiation Imager With High Integrity Barrier Layer and Method of Fabricating," Ser. No. 08/099,370, filed Jul. 29, 1993.

*Primary Examiner*—William Mintel
*Attorney, Agent, or Firm*—Donald S. Ingraham; Marvin Snyder

[57] ABSTRACT

A radiation imager includes a photosensor array having a plurality of individually addressable pixels, each pixel having a photosensor island and an associated thin film transistor (TFT) disposed to selectively electrically couple the photosensor island to a predetermined address line. In each pixel a single common passivation layer is disposed over the TFT and the photosensor island such that the passivation layer is adjacent to both the outer surfaces of the TFT and portions of the photosensor island. In a method of fabricating a photosensor array as described above, after depositon of a source-drain metal layer, the layer is left unpatterned until after the photosensor island has been formed. In the formation of the photosensor island the source-drain metal layer serves as an etch stop to protect the TFT. Following formation of the photosensor island, the source-drain metal layer is patterned to form source and drain electrodes and fabrication of the TFT is completed. The single common passivation layer is then deposited over both the TFT and the photosensor island.

10 Claims, 3 Drawing Sheets

RADIATION IMAGER WITH SINGLE PASSIVATION DIELECTRIC FOR TRANSISTOR AND DIODE

BACKGROUND OF THE INVENTION

This application relates to solid state radiation imagers and in particular to a common passivation barrier for transistor and photodiode components and the method of fabricating such an imager.

Solid state imagers typically include a photosensor array coupled to a scintillating medium. Radiation absorbed in the scintillator generates optical photons which in turn pass into a photosensor, such as a photodiode, in which the optical photon is absorbed and an electrical signal corresponding to the incident optical photon flux is generated. Substantially hydrogenated amorphous silicon (a-Si) is commonly used in the fabrication of photosensors due to the advantageous photoelectric characteristics of a-Si and the relative ease of fabricating such devices. In particular, photosensitive elements, such as photodiodes, can be formed in connection with necessary control or switching elements, such as thin film transistors (TFT's), in a relatively large array.

Imager and display arrays are typically fabricated on large substrates on which many components, including TFTs, address lines, and devices such as photosensors, am formed through the deposition and patterning of layers of conductive, semiconductive, and insulative materials. The array is comprised of pixels, with the address lines and associated TFTs being coupled together to enable the photosensor in each pixel of the array to be respectively addressed, so that, for example, the charge developed by each photosensor can be selectively read. The TFT fabrication process involves several patterning steps to produce the desired arrangement of a channel region between a source and a drain electrode with the desired arrangement of semiconductive material disposed between the electrodes and over the gate electrode. The TFT is electrically coupled to a respective photosensor, such as a photodiode, which is disposed to absorb incident photons and accumulate the resulting charge produced in the diode.

The fabrication process for such an imaging array typically includes steps to fabricate the TFT, including forming source and drain electrodes and associated contact pads to address lines and the photosensor. The TFT and related assemblies are then coated with a protective passivation coating, which must then be patterned to provide via openings for electrical contact between the photosensor body and an underlying photosensor electrode (or contact pad, which couples the photosensor to the TFT. The a-Si for the photodiode body is then deposited and patterned; the presence of the protective passivation layer over the TFT assemblies is necessary to ensure that a-Si portions of the TFT are not damaged by the patterning process for the photosensor island (as the etchants used to form the a-Si body would similarly etch TFT components if allowed to come in contact with such a-Si portions).

As the conventional fabrication process involves the deposition of a separate passivation layer over the TFT before fabrication of the photosensor body, a portion of the passivation material abuts the photosensor contact pad in the form of a "lip" or build up of the TFT protective passivation layer material over the edges of the photosensor island bottom contact pad. This buildup of passivation material results in the subsequently deposited a-Si conforming to the shape of this lip, resulting in the lip portion of the passivation layer being disposed between the overlying a-Si material and the photosensor island bottom contact pad. It has been observed, however, that such an arrangement results in increased photodiode leakage, especially when the thickness of the passivation material between the a-Si of the photosensor island and the bottom contact pad is thicker than about 0.5 $\mu$m.

In the conventional array formation process, after formation of the photosensor island another passivation layer is deposited over the array to provide electrical insulation between the photosensor island (except at a predetermined contact area) and the common electrode of the photosensor array, which is disposed over the passivation layer. Further, the passivation layer over the photosensor protects the a-Si photosensor from environmental conditions (such as moisture) that can degrade its performance and also protects the array from exposure to materials, such as solvents, used in remaining steps of the fabrication process. Typically a scintillator is then deposited over the common electrode of the photosensor array to complete the imager wafer structure.

An object of this invention is to provide a method of fabricating an imager array having fewer steps and resulting in the elimination of one dielectric layer in the assembled array.

It is a further object of this invention to provide an imager having a structure with a single common passivation layer for the TFT and photosensor in each pixel of the array.

A still further object of the invention is to provide an imager having a photodiode structure conducive to low leakage operation of the photodiode.

SUMMARY OF THE INVENTION

A solid state radiation imager in accordance with this invention includes a photosensor array disposed on a substrate, the photosensor array comprising a plurality of individually-addressable pixels. Each of the pixels comprises a photosensor island of photosensitive material disposed on a contact electrode; a thin film transistor (TFT) electrically coupled to the photosensor contact electrode and to respective scan and data lines so that the TFT is disposed to selectively couple the photosensor island to the data line; and, a single common passivation layer disposed over the TFT and photosensor island. The single common passivation layer is disposed so that it is adjacent to the outer surface of the TFT and at least portions of the outer surface of the photosensor island. The single common passivation layer comprises either a single tier or multiple tiers (or strata) of dielectric material. The photosensor island typically comprises amorphous silicon (a-Si) that is disposed over the photosensor island bottom contact and substantially no portion of the passivation layer is disposed between the a-Si photosensor body and the bottom contact pad.

A method of fabricating a radiation imager having a plurality of individually-addressable pixels includes the steps, for each pixel, of forming a TFT body on a substrate up to the point of depositing a source-drain metal layer, depositing a source-drain metal layer over the TFT body and remaining portions of the pixel area, forming a photosensor island on the source-drain metal layer such that the photosensor island occupies portions of the pixel other than where the respective TFT is disposed, and patterning the source-drain metal layer so as to form respective TFT source and drain electrodes and associated contacts to the photosensor island and predetermined address lines. The source-drain metal layer serves as an etch protectant in the formation process of the photosensor island such that the a-Si etchants used in formation of the photosensor island do not etch the TFT body. Source-drain metal layer comprises two layers of metal, or alternatively, a single metal layer. Etch protection of the TFT body is provided by the etchant used in forming the a-Si photosensor island being selective to the material comprising the upper surface of the source-drain metal layer, or alternatively, depositing the source-drain metal layer to a thickness such that not more than about 90% of the thickness of the layer is removed in the etching of the a-Si photosensor island with an etchant that is not selective to the source-drain metal.

BRIEF DESCRIPTION OF THE DRAWINGS

The features of the invention believed to be novel are set forth with particularity in the appended claims. The invention itself, however, both as to organization and method of operation, together with further objects and advantages thereof, may best be understood by reference to the following description in conjunction with the accompanying drawings in which like characters represent like parts throughout the drawings, and in which:

DETAILED DESCRIPTION OF THE INVENTION

Figure 1:
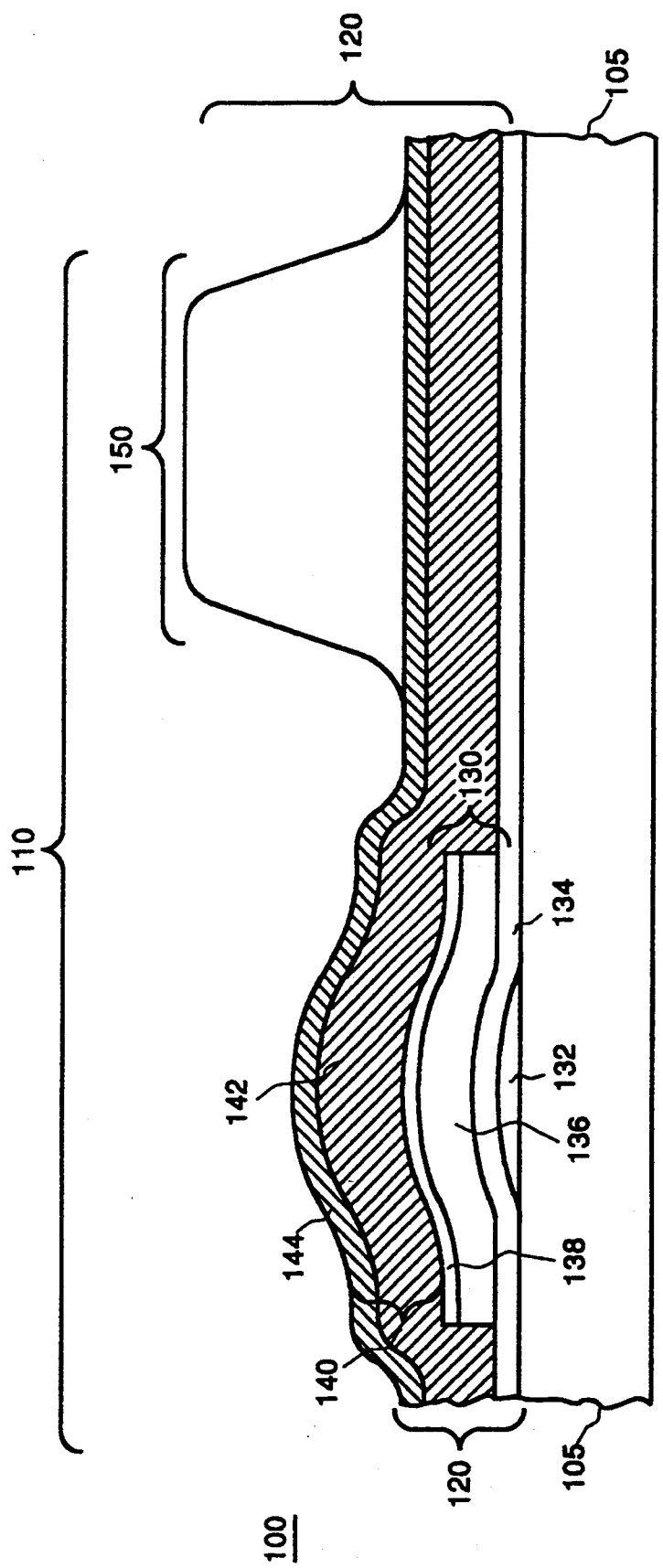
FIG. 1 is a cross-sectional view of a portion of a pixel of a radiation imager at one stage in the fabrication process in accordance with this invention.

A radiation imager 100 fabricated in accordance with this invention comprises a plurality of pixels 110, a representative one of which is illustrated in FIG. 1. Imager, as used herein, refers to a solid state device that is adapted to absorb incident radiation of a particular wavelength and generate an electrical signal corresponding to the absorbed radiation. As each pixel 110 is individually addressable, the spatial distribution of radiation absorbed by the array is also determinable. Typically the imager is electrically coupled to electrical circuits not situated on the wafer that amplify and process the electrical signals generated by the array.

For purposes of illustration and not limitation, a representative pixel 110 is illustrated in the Figures herein and the accompanying description refers to that representative pixel; typically, in accordance with known fabrication processes, fabrication of all pixels on substrate 105 that will form a particular imager wafer proceeds simultaneously.

Imager 100 comprises a photosensor array 120 disposed on a substrate 105. In the fabrication of imager 100, in each pixel 110, a TFT body 130 is formed on substrate 105 in accordance with processes known in the art. "TFT body", as used herein, refers generally to the materials disposed on substrate 105 at different stages in the fabrication process that will comprise the TFT in the assembled array; thus, dependent on the stage of the fabrication process, TFT body 130 does not necessarily comprise all components necessary for a functioning TFT, although when the fabrication process is completed TFT body 130 will comprise an operable TFT (which will similarly be referred to as TFT 130). At the stage of the assembly process illustrated in FIG. 1, TFT body 130 comprises a gate electrode 132 (typically comprising a conductive material such as chromium, titanium, molybdenum, aluminum, or the like); a gate dielectric layer 134 disposed thereover (and typically comprising an inorganic dielectric material such as silicon nitride or silicon dioxide); a semiconductor material layer 136 disposed over gate dielectric layer 134 (semiconductor material layer 136 typically comprising amorphous silicon (a-Si)); and a doped semiconductor material layer 138 (typically comprising a-Si doped to exhibit n+conductivity) disposed over semiconductor material layer 136. If desired for protection of the doped semiconductive material, a relatively thin protective layer (not shown) is deposited over doped semiconductive material layer 138 prior to patterning, in accordance with known procedures, such as photolithography, semiconductor material layer 136 and doped semiconductor material layer 138 to form a portion TFT body 130 disposed over gate electrode 132. The relatively thin protective layer over doped semiconductive layer 136 typically comprises a metal selected to comprise the same metal as the immediate layer of the source-drain metal that is deposited thereover, as described below. After deposition of the overlying source-drain metal, the protective layer over the doped semiconductive material comprises part of the source-drain metal layer and is not readily distinguishable from the immediately adjacent source-drain metal.

Source-drain metal layer 140 is then deposited over TFT body 130 and remaining portions of the pixel 110. In accordance with this invention, source-drain metal layer 140 comprises an etch protectant for TFT body 130; as used herein "etch protectant" refers to a layer that substantially prevents contact between TFT body 130 and etchants used in formation, as described below, of an a-Si photosensor island 150 on the surface of source-drain metal layer 140. In one embodiment of the present invention, source-drain metal comprises a conductive material selected to exhibit the desired characteristics as an etch stop in fabrication steps of photosensor island 150. For example, the a-Si photosensor islands are typically formed by etching the a-Si in plasma gasses comprising fluorine or chlorine (such as carbon tetrafluoride ($CF_4$); sulfur hexafluoride ($SF_6$); or hydrogen chloride gas (HCl)). It is thus desirable that the etchant used in forming the photosensor be selective to the conductive material comprising the upper surface of source-drain metal layer 140 ("upper" or "outer" surface as used herein refers to the surface of the layer furthermost from substrate 105; no restriction as to orientation of the device in fabrication or operation is implied). Alternatively, source-drain metal layer 140 comprises a material that is susceptible to etching by the etchant used in formation of a-Si photosensor island 150 but has a thickness of a magnitude such that not greater than about 90% of source-drain metal layer 140 is etched away in the etching process to form a-Si photosensor island 150. Other considerations in the selection of source-drain metal layer 140 include resistivities of the conductive material.

Figure 2:
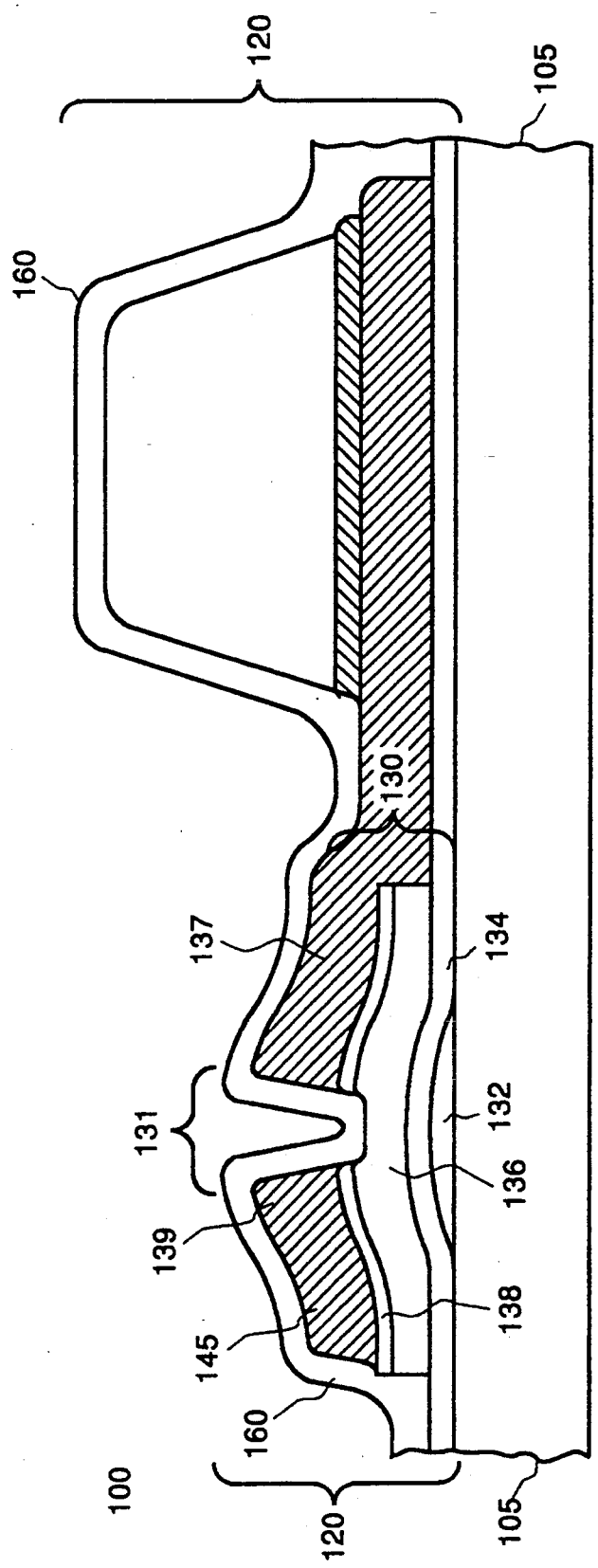
FIG. 2 is a cross-sectional view of a portion of a pixel of a radiation imager at a later stage in the fabrication process in accordance with this invention.

In one embodiment, the source-drain metal is selected to be used both to form the source-drain electrodes for TFT body 130 and also to form a data line 145 (data line 145 is one of the address lines to which TFT 130 is electrically coupled, the other address line being a scan line (not shown) to which gate electrode 132 is electrically coupled). Data line 145 as shown in FIG. 2 would extend out of the plane of the figure and is illustrated comprising the same source-drain metal comprising the source and drain electrodes for TFT 130. In this embodiment source-drain metal layer 140 typically comprises a two-tier structure comprising a first conductive layer 142 and a cap layer 144 (also known as an etch-stop layer) comprising a second conductive material. First conductive layer 142 typically comprises a material having a relatively low resistivity (e.g., less than about 10 $\mu\Omega$/cm), such as molybdenum, or the like. First conductive layer 142 is deposited in a sputtering process to a thickness in the range between about 100 nm and 1000 nm. Cap layer 144 is deposited over first conductive layer 142 and comprises a material selected to exhibit the desired etch stop characteristics in the presence of etchants used in the formation of the photosensor. Cap layer 144 comprises chromium, titanium, or the like, and is deposited in a sputter deposition process to a thickness in the range between about 10 nm and 100 nm, and commonly has a thickness of about 50 nm.

In accordance with this invention, prior to patterning source-drain metal layer 140, a photosensor island 150 is formed on source-drain metal layer 140 such that the photosensor island substantially occupies portions of the area of pixel 120 other than where TFT body 130 is disposed. The formation of photosensor island 150 comprises depositing a layer of photosensitive material over source-drain metal layer 140 and then patterning the photosensitive material layer to produce photosensor island 150. The patterning steps typically comprise forming a mask (not shown) on the photosensitive material (such as by depositing photoresist, exposing the photoresist in accordance with a desired pattern, and then processing the photoresist to remove portions thereof, leaving a mask having a selected pattern corresponding to the desired shape of photosensor island 150) and then etching the photosensor material with an etchant selective to the material comprising the upper surface of the source-drain metal layer 140 (as illustrated in FIG. 1, cap layer 144) so as to remove the photosensitive material and expose the source-drain metal layer in unmasked areas of the pixel. The photosensitive material comprises a-Si and typically comprises a layer of intrinsic amorphous silicon disposed between an a-Si layer doped to exhibit n type conductivity and an a-Si layer doped to exhibit p type conductivity. The etchant used in etching the silicon forming photosensor island 150 typically comprises either fluorine or chlorine, e.g., carbon tetrafluoride ($CF_4$); sulfur hexafluoride ($SF_6$); or hydrogen chloride gas (HCl). These etchants are selective to the material comprising cap layer 144 (e.g., chromium), and the presence of source-drain metal layer 140 having an upper surface (e.g., cap layer 144) that serves as an etch-stop protects TFT body 130 (especially the a-Si components in TFT body) from attack by the etchants used in forming photosensor island 150.

Following formation of photosensor island 150, fabrication of TFT 130 is completed. In the embodiment of the invention illustrated in FIGS. 1 and 2, exposed portions of cap layer 144 are removed in an etching process, e.g., a wet etching process using hydrochloric acid (HCl), or alternatively a dry etching process, such as reactive ion etching with chlorine and oxygen (photosensor island 150 serving as a mask for etching the exposed cap layer material), leaving photosensor island 150 disposed over the remaining portions of cap layer 144 (which forms the contact pad for the photosensor island to the TFT) and the (intact) first conductive layer 142 of source-drain metal layer 140. In accordance with this invention, photosensor island 150 is disposed adjacent to the remaining portion of cap layer 144 comprising the photosensor contact pad such that substantially no material is disposed therebetween at any position where the photosensor island overlies the contact electrode, thus providing a structure that reduces photodiode leakage.

Remaining portions of source-drain metal layer 140 are next patterned to form a source electrode 137 (FIG. 2) and a drain electrode 139 for TFT 130 using, for example, known photolithographic techniques. Further, to complete fabrication of the TFT 130, doped semiconductor layer 138 is etched, for example in a reactive ion etching process comprising HCl and $SF_6$ (or alternatively, either of these gasses separately), in the area between source electrode 137 and drain electrode 139 to form a channel region 131 substantially disposed over gate electrode 132.

In accordance with this invention, a common passivation layer 160 is then deposited over pixel 110 so that it is disposed adjacent to the outer surfaces of both TFT 130 and photosensor island 150. Passivation layer 160 is substantially monolithic, that is, it comprises material that is substantially uniformly disposed across the pixel area in a deposition process so that there are not intervening materials between the passivation material and the covered components at different points on the array. Passivation layer 160 comprises either an inorganic dielectric material such as silicon nitride, silicon dioxide, or the like, or alternatively an organic dielectric material, such as polyimide. Inorganic materials such as silicon nitride or silicon oxide are typically deposited using plasma enhanced chemical vapor deposition, and such a single layer of inorganic dielectric material comprising passivation layer 160 typically has a thickness in the range of between about 0.5 $\mu$m and 1.0 $\mu$m. Organic dielectric materials such as polyimide are typically deposited by a spin coating process to a thickness in the range between about 0.5 $\mu$m and 2.5 $\mu$m. Alternatively, as disclosed in co-pending application entitled "Photosensitive Element With Two Layer Passivation Coating", now U.S. Pat. No. 5,233,181, which is assigned to the assignee of the present invention and incorporated herein by reference, passivation layer 160 comprises multiple layers of dielectric material, for example a first layer (not shown) of inorganic dielectric material such as silicon nitride and a second layer comprising an organic dielectric material such as polyimide.

Following deposition of passivation layer 160, a common electrode 170 (FIG. 3) is formed. Portions of passivation layer 160 disposed over the top surface of photosensor island 150 are patterned, using, e.g., known photolithographic techniques, to form a via opening 165 to a contact area 159 on the photodiode. Common electrode 170 is then deposited so that it is disposed over passivation layer 160 and in via opening 165 so as to be in electrical contact with contact area 159. Common electrode 170 typically comprises a substantially light transmissive conductive material such as indium tin oxide or the like, and is deposited in a sputtering process to a thickness in the range between about 0.05 μm and 0.5 μm. Formation of common electrode 170 completes the fabrication steps necessary to form the components of photosensor array 120 (other steps, not pertinent to the present invention, such as disposing a scintillator on the photosensor array, are necessary to complete fabrication of imager wafer 100).

In one alternative embodiment of the present invention, cap layer 144 is not removed after patterning photosensor island 150. In this embodiment, cap layer 140 remains part of source-drain metal layer 140 in the assembled device.

In another alternative embodiment of the method of this invention, a separately-deposited metal layer having the desired low-resistance characteristics is used to form a separate data line (not shown) after the fabrication of TFT 130 is complete; in this embodiment source-drain metal layer 140 typically comprises a single layer of conductive material having the desired etch stop characteristics, such as chromium or the like. Source-drain metal layer 140 in this embodiment is typically deposited in a sputtering process to a thickness in the range between about 50 nm and 500 nm. Except as noted herein, other steps in the imager fabrication process are the same as described above.

In a further embodiment of the method of this invention, source-drain metal layer 140 comprises a single layer of metal that is not resistant to etchants used in formation of photosensor island 140. Etch protection for TFT body 130 is provided by depositing source-drain metal layer 140 to a selected thickness such that, after completion of formation of photosensor island 150, sufficient source-drain metal material remains to be patterned to form source electrode 137 and drain electrode 139, each of these electrodes having sufficient thickness so as to provide a predetermined relatively low resistance. Typically in this embodiment source-drain metal layer 140 comprises molybdenum deposited to a thickness of between about 200 nm and 2000 nm, which thickness is sufficient such that not greater than about 90% the thickness of the layer is removed in the etching of photosensor island 150. The remaining portions of source-drain metal layer 140, when patterned to form source electrode 137 and drain electrode 139 exhibit relatively low resistance so that photosensor array noise is maintained at or below an acceptable level for the particular application of the array. Except as noted herein, other steps in the imager fabrication process are the same as described above.

The process of the present invention thus eliminates one passivation layer and two patterning steps as compared with the conventional array fabrication processes. In the conventional process, the TFT fabrication is completed prior to the formation of the photosensor islands, thus necessitating a separate passivation layer deposited over the TFT alone to protect it during the fabrication of the photosensor islands. This separate passivation layer must be patterned to provide the necessary contact area to source-drain metal for the contact between the photodiode and the TFT. The second photolithographic step that is obviated by the process of the current invention is the step to make the via contacts (not shown) at the edges of the array structure for address line connections to contact fingers (that are coupled to contacts for the processing circuits off of the array). In the conventional array fabrication techniques, the presence of the two separate passivation layers necessitated separate masking steps to form the via contacts through the multiple passivation layers, whereas the single common passivation layer of the present invention enables one photolithographic step to be used to form the via contacts.

Figure 3:
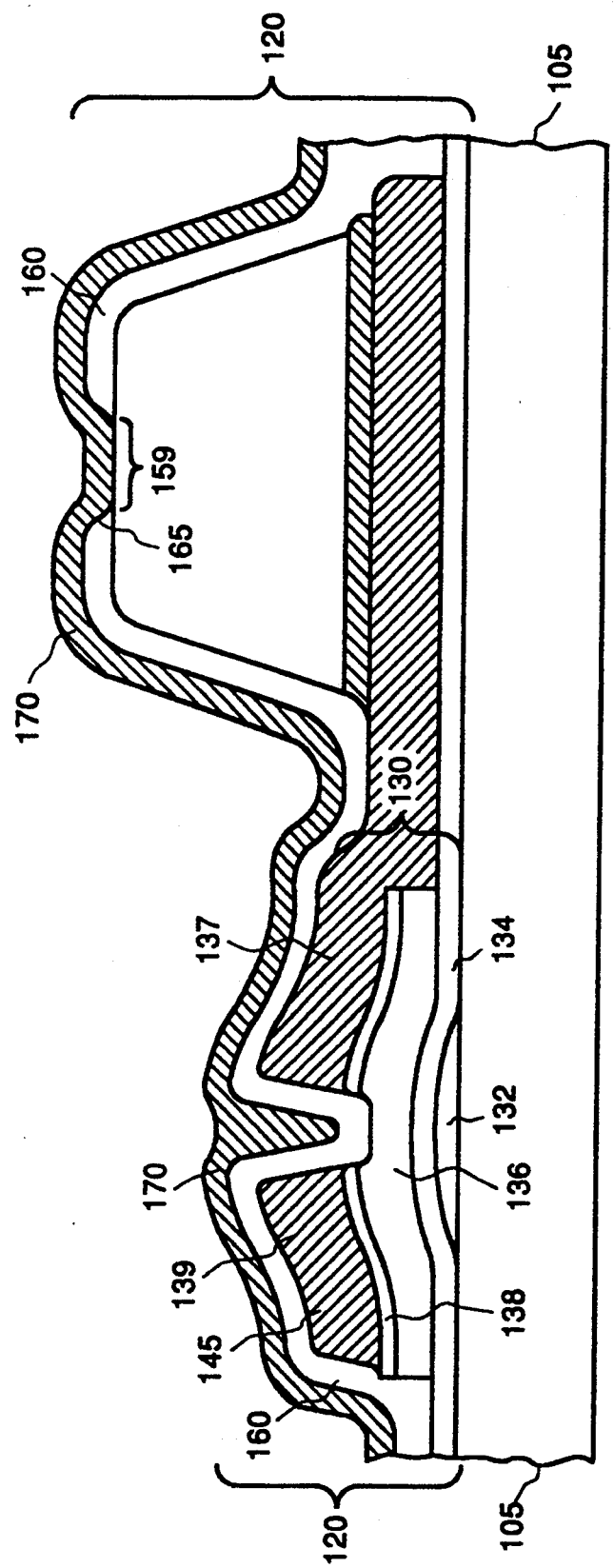
FIG. 3 is a further cross-sectional view of a portion of a pixel of a radiation imager at the stage in the fabrication process in accordance with this invention when the photosensor array has been completed.

As illustrated in FIG. 3, each pixel of the imager fabricated in accordance with this invention thus comprises photosensor array 120 having a single common passivation layer 160 that is disposed adjacent to (that is, in physical contact with) the outer surfaces of both TFT 130 and at least some portion (excluding, that is, the contact area 159 that is in contact with common electrode 170) of photosensor island 150. Further, as noted herein, the photosensor array in accordance with the present invention provides a photosensor island 150 in which the a-Si is disposed in contact with the underlying photosensor bottom contact pad over the entire length of the bottom contact pad, thus providing a structure that is less prone to diode leakage.

While only certain features of the invention have been illustrated and described herein, many modifications and changes will occur to those skilled in the art. It is, therefore, to be understood that the appended claims are intended to cover all such modifications and changes as fall within the true spirit of the invention.

What is claimed is:

1. A solid state radiation imager comprising:
  a photosensor array disposed on a substrate, said photosensor array comprising a plurality of individually-addressable pixels, each of said pixels comprising:
  a photosensor having a body comprising photosensitive material disposed on an electrically conductive contact pad comprising a first conductive material;
  a thin film transistor (TFT) having a source-drain metal layer comprising said first conductive material: said source-drain metal layer being electrically coupled to and contiguous with said photosensor contact pad; said source-drain metal layer further being electrically coupled to an address line, said TFT being disposed so as to selectively couple said photosensor to said address line;
  a substantially monolithic common passivation layer disposed over said TFT and said photosensor, said passivation layer being disposed adjacent to an outer surface of said TFT and at least portions of an outer surface of the photosensor island; and
  a common electrode layer disposed over said common passivation layer, said common electrode being coupled to said photosensor at an upper surface of said photosensor body.

2. The radiation imager of claim 1 wherein said common passivation layer comprises an organic dielectric material.

3. The radiation imager of claim 2 wherein said organic dielectric material comprises polyimide.

4. The radiation imager of claim 1 wherein said common passivation layer comprises an inorganic dielectric material.

5. The radiation imager of claim 4 wherein said inorganic dielectric material is selected from the group consisting of silicon oxide and silicon nitride.

6. The radiation imager of claim 1 wherein said passivation layer comprises a first and a second stratum, one of said strata comprising inorganic material and the other of said strata comprising organic dielectric material.

7. The radiation imager of claim 1 wherein said photosensor island is disposed adjacent to said contact pad such that substantially no passivation layer material is disposed therebetween at any position where said photosensor island overlies said contact pad.

8. The radiation imager of claim 7 wherein said photosensor island contact pad comprises chromium.

9. The radiation imager of claim 8 wherein the source and drain of said TFT comprise a conductive material selected from the group consisting of molybdenum and titanium.

10. The radiation imager of claim 9 wherein said photosensor comprises a photodiode.

* * * * *